US012685184B2

(12) United States Patent
Takeuchi

(10) Patent No.: US 12,685,184 B2
(45) Date of Patent: Jul. 14, 2026

(54) SEMICONDUCTOR MODULE

(71) Applicant: Mitsubishi Electric Corporation,
Tokyo (JP)

(72) Inventor: Kensuke Takeuchi, Tokyo (JP)

(73) Assignee: Mitsubishi Electric Corporation,
Tokyo (JP)

( * ) Notice: Subject to any disclaimer, the term of this
patent is extended or adjusted under 35
U.S.C. 154(b) by 834 days.

(21) Appl. No.: 18/011,384

(22) PCT Filed: Oct. 12, 2020

(86) PCT No.: PCT/JP2020/038472
§ 371 (c)(1),
(2) Date: Dec. 19, 2022

(87) PCT Pub. No.: WO2022/079759
PCT Pub. Date: Apr. 21, 2022

(65) Prior Publication Data
US 2023/0238310 A1     Jul. 27, 2023

(51) Int. Cl.
*H10W 72/50*          (2026.01)
*H10W 70/40*          (2026.01)
(Continued)

(52) U.S. Cl.
CPC ....... *H10W 70/424* (2026.01); *H10W 70/481*
(2026.01); *H10W 90/00* (2026.01);
(Continued)

(58) Field of Classification Search
CPC ......... H01L 23/49548; H01L 23/49562; H01L
23/49575; H01L 23/3107; H01L 23/3142;
(Continued)

(56) References Cited

U.S. PATENT DOCUMENTS

2004/0251528 A1* 12/2004 Kikuchi .............. H10W 70/421
257/E23.044
2007/0052073 A1* 3/2007 Kohashi .............. H10W 74/473
257/676
(Continued)

FOREIGN PATENT DOCUMENTS

CN          202423603 U      9/2012
CN          109075147 A     12/2018
(Continued)

OTHER PUBLICATIONS

Office Action issued Sep. 27, 2024 in Chinese Application No.
202080105748.1.

(Continued)

*Primary Examiner* — Omar F Mojaddedi
(74) *Attorney, Agent, or Firm* — Sughrue Mion, PLLC

(57) ABSTRACT

This semiconductor module includes: a base plate formed in
a plate shape; a terminal member; an electronic component
joined to one surface of the base plate; and mold resin
sealing the base plate, the terminal member, and the elec-
tronic component. The base plate and the terminal member
are conductive members and are arranged with an interval
therebetween on the same plane. Each of the base plate and
the terminal member has a body portion and a terminal
portion exposed to outside from the mold resin. The base
plate has a through hole at an extension part which is a part
extending toward the terminal portion and connected to the
terminal portion, in the body portion.

18 Claims, 9 Drawing Sheets

(51) Int. Cl.
　　*H10W 72/60*　　(2026.01)
　　*H10W 90/00*　　(2026.01)
　　*H10W 72/00*　　(2026.01)

(52) U.S. Cl.
　　CPC ....　*H10W 90/811* (2026.01); *H10W 72/07554*
　　　　(2026.01); *H10W 72/871* (2026.01); *H10W*
　　　　*90/755* (2026.01); *H10W 90/763* (2026.01);
　　　　　　　　　　*H10W 90/767* (2026.01)

(58) Field of Classification Search
　　CPC ......... H01L 23/49524; H01L 23/49541; H01L
　　　　24/40; H01L 24/48; H01L 24/73; H01L
　　　　24/37; H01L 24/42; H01L 24/84; H01L
　　　　　25/16; H01L 25/072; H10W 90/00;
　　　　H10W 90/811; H10W 90/755; H10W
　　　　90/763; H10W 90/767; H10W 90/759;
　　　　　H10W 90/766; H10W 74/00; H10W
　　　　74/111; H10W 74/127; H10W 72/07554;
　　　　H10W 72/871; H10W 72/076; H10W
　　　　72/50; H10W 72/60; H10W 72/926;
　　　　H10W 70/424; H10W 70/481; H10W
　　　　　　　70/421; H10W 70/466
　　See application file for complete search history.

(56)　　　　References Cited

U.S. PATENT DOCUMENTS

| 2016/0079221 A1* | 3/2016 | Inokuchi | H01L 23/49575 |
| | | | 438/123 |
| 2019/0057921 A1* | 2/2019 | Ooshima | H10W 74/127 |

FOREIGN PATENT DOCUMENTS

| JP | 2003-324176 A | 11/2003 |
| JP | 2005-311214 A | 11/2005 |
| JP | 2006-253734 A | 9/2006 |
| WO | 2017/179394 A1 | 10/2017 |

OTHER PUBLICATIONS

Japanese Office Action issued Jul. 4, 2023, in Application No. 2022-557232.

Communication issued Dec. 17, 2024 in Chinese Application No. 202080105748.1.

International Search Report of PCT/JP2020/038472 dated Dec. 22, 2020 [PCT/ISA/210].

Extened European Search Report dated Oct. 24, 2023 in Application No. 20957588.5.

* cited by examiner

SEMICONDUCTOR MODULE

CROSS REFERENCE TO RELATED APPLICATIONS

This application is a National Stage of International Application No. PCT/JP2020/038472 filed on Oct. 12, 2020.

TECHNICAL FIELD

The present disclosure relates to a semiconductor module.

BACKGROUND ART

For a device that performs power conversion, and the like, a semiconductor module having therein an electronic component such as a semiconductor switching element is used. The semiconductor module is formed such that a semiconductor switching element is provided on a base plate which is a conductive member, electrode pads provided on upper surfaces of a plurality of semiconductor switching elements are connected by jumper wires or bonding wires, and then these are sealed with mold resin. On an outer peripheral side surface of the mold resin, a plurality of terminal portions such as positive and negative power supply terminals, an output terminal to a load, and a control terminal for controlling the semiconductor switching elements are arranged. Inside the semiconductor module, a shunt resistor for current detection, and the like, are also provided in addition to the plurality of semiconductor switching elements.

As a terminal structure exposed to outside from the mold resin of the semiconductor module, disclosed is a structure in which a part of a base plate on which a semiconductor switching element is provided is led to outside so as to be directly used as a terminal portion (see, for example, Patent Document 1).

CITATION LIST

Patent Document

Patent Document 1: Japanese Laid-Open Patent Publication No. 2003-324176

SUMMARY OF THE INVENTION

Problems to be Solved by the Invention

In the terminal structure of the semiconductor module in Patent Document 1, at the time of preheating the tip of the terminal portion in a post-process of mounting the semiconductor module to a device, heat is transferred from the terminal portion to the base plate side where the semiconductor switching element is provided, thus causing a problem that soldering performance for the terminal portion is deteriorated.

Accordingly, an object of the present disclosure is to obtain a semiconductor module in which heat conduction from a terminal portion to a body portion of a base plate to which an electronic component is joined is suppressed.

Solution to the Problems

A semiconductor module according to the present disclosure includes: a base plate formed in a plate shape; a terminal member; an electronic component joined to one surface of the base plate; and mold resin sealing the base plate, the terminal member, and the electronic component. The base plate and the terminal member are conductive members and are arranged with an interval therebetween on the same plane. Each of the base plate and the terminal member has a body portion and a terminal portion exposed to outside from the mold resin. The base plate has a through hole at an extension part which is a part extending toward the terminal portion and connected to the terminal portion, in the body portion.

Effect of the Invention

In the semiconductor module according to the present disclosure, the base plate to which the electronic component is joined has the body portion and the terminal portion exposed to outside from the mold resin, and the base plate has the through hole at the extension part which is the part extending toward the terminal portion and connected to the terminal portion, in the body portion. Thus, the sectional area of the base plate is reduced at the extension part, whereby the semiconductor module in which heat conduction from the terminal portion to the body portion of the base plate is suppressed can be obtained.

DESCRIPTION OF EMBODIMENTS

Figure 1:
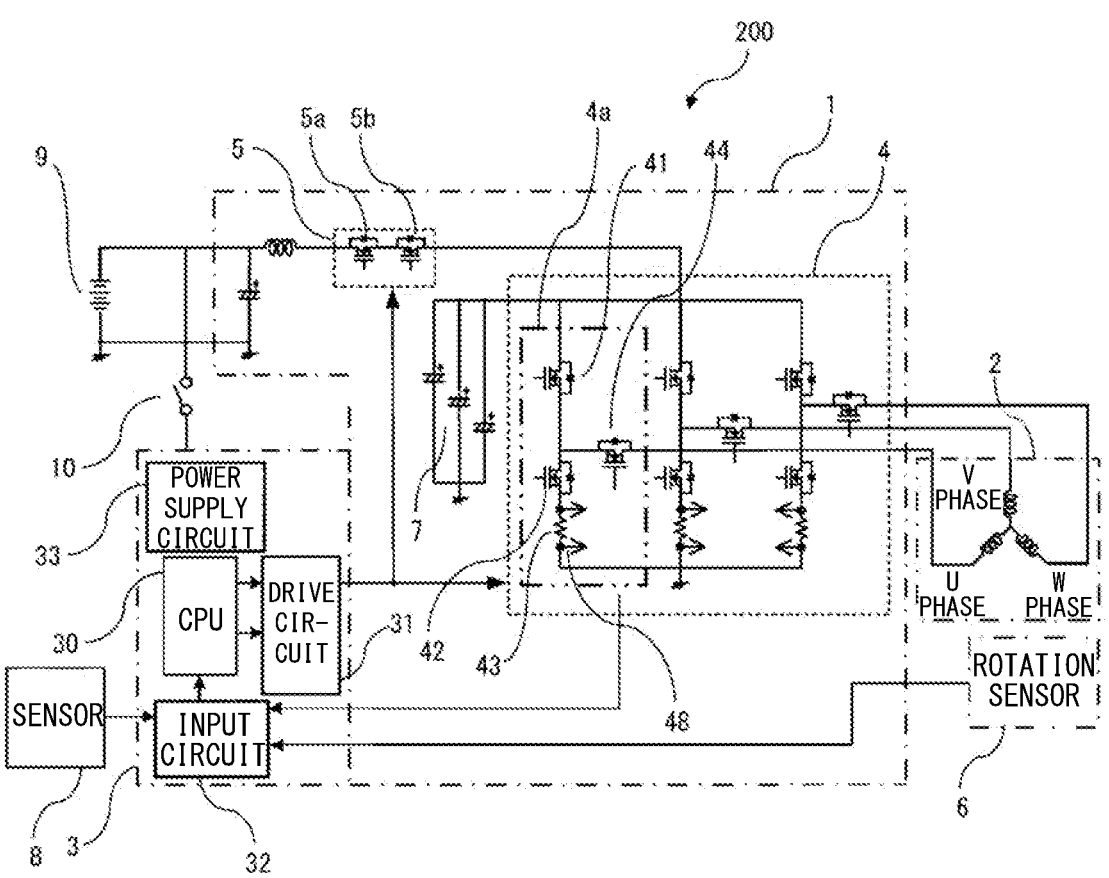
FIG. 1 shows a circuit configuration of a device including a semiconductor module according to embodiment 1.

Hereinafter, a semiconductor module according to embodiments of the present disclosure will be described with reference to the drawings. In the drawings, the same or corresponding members and parts are denoted by the same reference characters, to give description.

Embodiment 1

Figure 2:
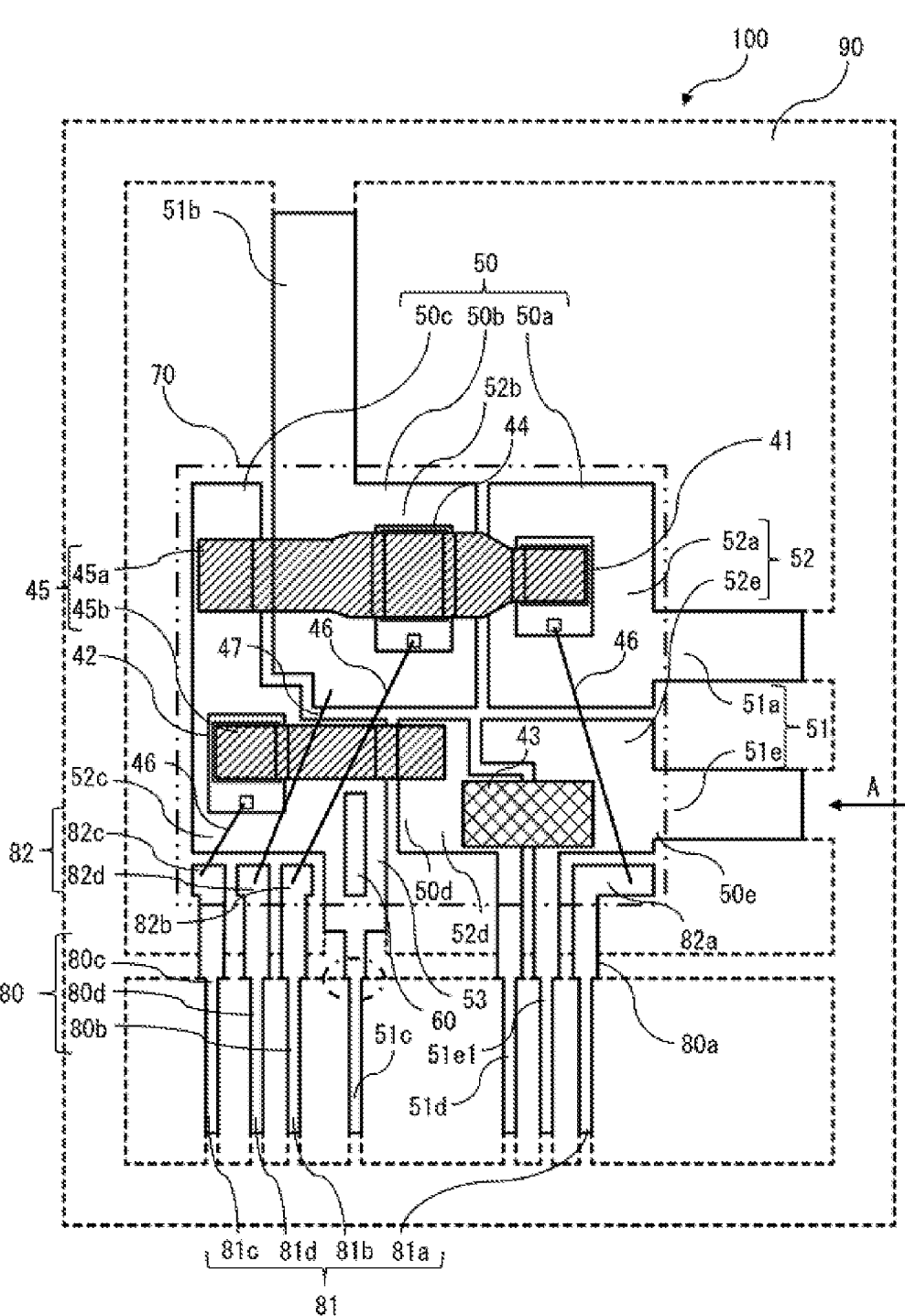
FIG. 2 is a plan view of the semiconductor module according to embodiment 1.
Figure 3:
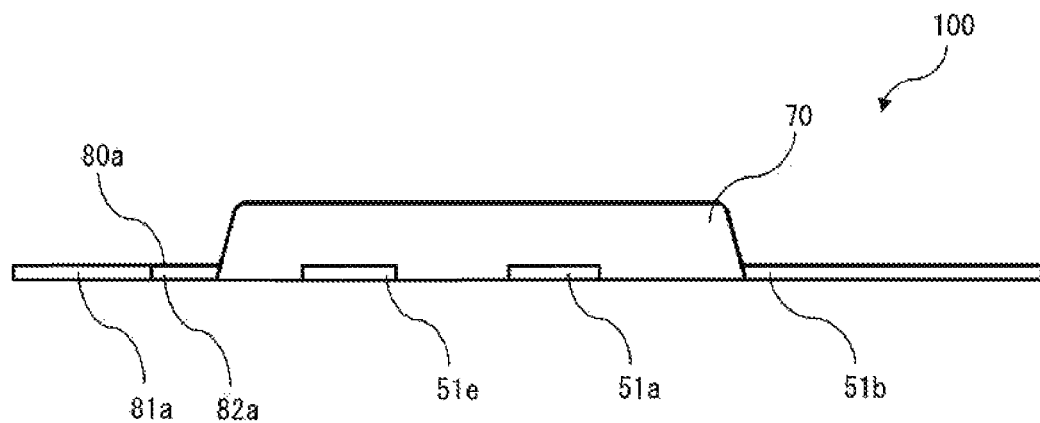
FIG. 3 is a side view of the semiconductor module according to embodiment 1.
Figure 4:
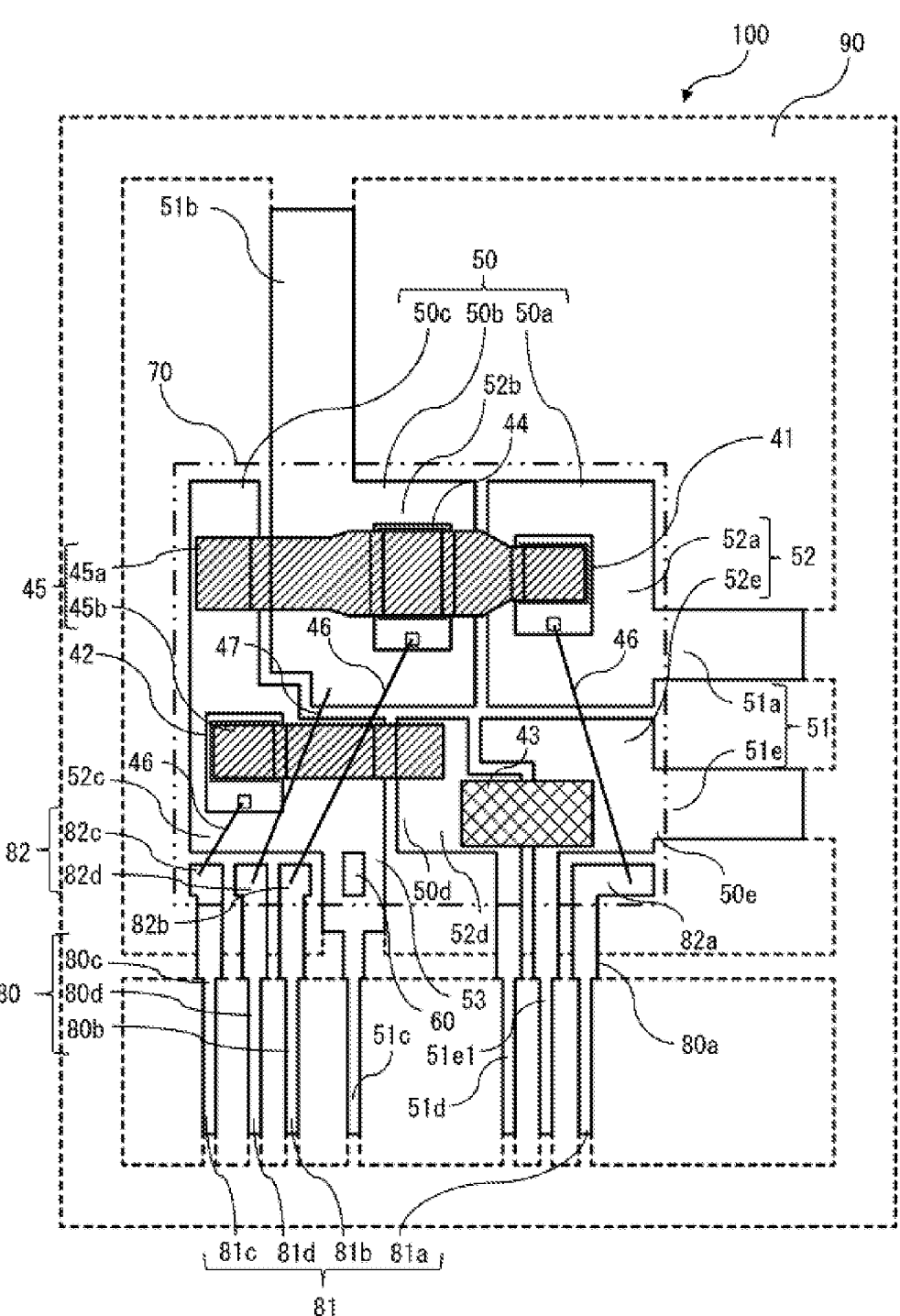
FIG. 4 is a plan view of another semiconductor module according to embodiment 1.
Figure 5:
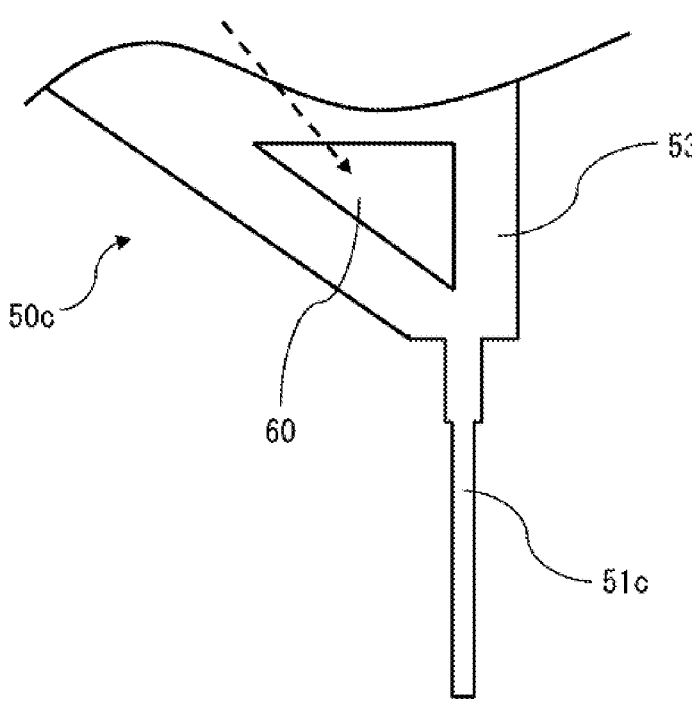
FIG. 5 is a major part plan view of another semiconductor module according to embodiment 1.

FIG. 1 shows a circuit configuration of the entire system of an electric power steering device 200 including a semiconductor module according to embodiment 1, FIG. 2 is a plan view showing the internal structure of a semiconductor module 100, FIG. 3 is a side view of the semiconductor module 100, FIG. 4 is a plan view of another semiconductor module 100 according to embodiment 1, and FIG. 5 is a major part plan view of another semiconductor module 100 according to embodiment 1. FIG. 2 shows a state in which mold resin 70 is removed, and a two-dot dashed line indicates the outer shape of the mold resin 70. In FIG. 2 and FIG. 4, an outer frame 90 provided in manufacturing of the semiconductor module 100 is indicated by broken lines. FIG. 3 is a side view of the semiconductor module 100 as seen in the direction of arrow A shown in FIG. 2. The semiconductor module 100 is used for a device that performs power conversion, and the like, and is a module having therein a plurality of semiconductor switching elements 41, 42, 44 for performing power conversion.

<Electric Power Steering Device 200>

As an example of the device including the semiconductor module, the electric power steering device 200 will be described. The electric power steering device 200 is a device that converts power supplied from a battery 9 and outputs the converted power to a motor 2. As shown in FIG. 1, the electric power steering device 200 is composed of a control unit 1, the motor 2, the battery 9, an ignition switch 10, and sensors such as a rotation sensor 6. The motor 2 is a brushless motor having windings for three phases (U phase, V phase, W phase). The rotation sensor 6 is provided near the motor 2, to detect the rotation angle of the motor 2, and outputs the detected rotation angle to a control circuit 3 provided to the control unit 1. A sensor 8 includes a torque sensor for detecting a steering wheel operation force, a vehicle speed sensor, and the like, and an electric signal corresponding to a physical quantity detected by each sensor is outputted to the control circuit 3.

The control unit 1 is composed of the control circuit 3 including a CPU 30, an inverter circuit 4 for supplying current to the windings of the motor 2, a power supply relay 5, and other electric components. The control unit 1 is connected to the battery 9 and the ignition switch 10, and power is supplied to the control unit 1 via the battery 9 and the ignition switch 10. The control unit 1 is connected to the rotation sensor 6 and the sensor 8, and electric signals outputted from these sensors are inputted to the control circuit 3 provided to the control unit 1.

The control circuit 3 is composed of the CPU 30, a driving circuit 31, an input circuit 32, and a power supply circuit 33 connected to these circuits. The input circuit 32 receives output signals from the rotation sensor 6 and the sensor 8, and outputs data such as rotation angle information of the motor 2 obtained from these output signals, to the CPU 30. The CPU 30 calculates a current value for rotating the motor 2 from the inputted data. The CPU 30 outputs a control signal corresponding to a calculation result to the inverter circuit 4 via the driving circuit 31. In addition, the CPU 30 receives a current detection signal detected in the inverter circuit 4 via the input circuit 32, and the CPU 30 performs feedback control for the inverter circuit 4 on the basis of the current detection signal.

The inverter circuit 4 is formed by bridge circuits respectively corresponding to the windings for three phases, i.e., U phase, V phase, and W phase of the motor 2. All the bridge circuits corresponding to the respective phases are the same circuit, and therefore a bridge circuit 4a for one phase (U phase) will be described. The bridge circuit 4a includes three semiconductor switching elements 41, 42, 44. The semiconductor switching element 41 on the high-potential side and the semiconductor switching element 42 on the low potential side are connected in series to each other. One side of the semiconductor switching element 44 is connected to an intermediate connection part between the semiconductor switching element 41 and the semiconductor switching element 42, and the other side of the semiconductor switching element 44 is connected to the coil for U phase of the motor 2. The semiconductor switching element 44 has a relay function capable of connection/interruption between the coil for U phase and the inverter circuit 4.

A shunt resistor 43 for detecting current is connected downstream of the semiconductor switching element 42 on the low-potential side. The potential difference between both ends of the shunt resistor 43 is detected and converted to a current value. For detecting the potential difference between both ends of the shunt resistor 43, the inverter circuit 4 is provided with terminals 48 at both ends of the shunt resistor 43. Monitored signals for various points in the inverter circuit 4 are inputted to the CPU 30 via the input circuit 32. Driving of the semiconductor switching elements 41, 42, 44 is controlled on the basis of a signal outputted from the driving circuit 31 in accordance with a command from the CPU 30.

The power supply relay 5 is provided upstream of the inverter circuit 4. The power supply relay 5 includes two semiconductor switching elements 5a, 5b connected in series. The power supply relay 5 has a relay function capable of supply/interruption of power to the inverter circuit 4. Capacitors 7 for smoothing are connected in parallel between the ground and the power supply to the inverter circuit 4.

Various types are conceivable for implementing the control unit 1 using a semiconductor module having therein a plurality of semiconductor switching elements. Examples include a semiconductor module having therein the bridge circuits forming the inverter circuit 4, a semiconductor module having therein the power supply relay 5, and a semiconductor module having therein a circuit in which some of the shunt resistors and the semiconductor switching elements are omitted.

<Semiconductor Module 100>

A case where the bridge circuit 4a for one phase is formed as the semiconductor module 100 will be described. As shown in FIG. 2, the semiconductor module 100 includes a base plate 50 formed in a plate shape, a terminal member 80, an electronic component joined to one surface of the base plate 50, and mold resin 70 sealing the base plate 50, the terminal member 80, and the electronic component. The base plate 50 and the terminal member 80 are conductive members made of the same material such as copper or a copper alloy. The base plate 50 and the terminal member 80 are arranged with an interval therebetween on the same plane. Here, five base plates 50 and four terminal members 80 are provided. The electronic components in the semiconductor module 100 are semiconductor switching elements 41, 42, 44 and the shunt resistor 43. Here, the semiconductor switching elements 41, 42, 44 are field effect transistors (FET). The electronic components joined to the base plates 50 are not limited thereto.

The semiconductor switching element 41 on the high-potential side is joined to one surface of a base plate 50a at a drain portion of the semiconductor switching element 41. The semiconductor switching element 42 on the low-potential side is joined to one surface of a base plate 50c at a drain portion of the semiconductor switching element 42. The semiconductor switching element 44 is joined to one surface of a base plate 50b at a drain portion of the semiconductor switching element 44. The shunt resistor 43 is joined so as to straddle one surface of the base plate 50d and one surface of the base plate 50e. The semiconductor switching elements 41, 42, 44 and the base plates 50 are connected by jumper wires 45 having a bridge shape and formed of a copper plate, for example. A jumper wire 45a connects a source portion of the semiconductor switching element 41, a source portion of the semiconductor switching element 44, and the base plate 50c. A jumper wire 45b connects a source portion of the semiconductor switching element 42 and the base plate 50d.

Each of the base plates 50 has a body portion 52 to which the electronic component is joined, and a terminal portion 51 exposed to outside from a side surface of the mold resin 70. The direction in which the terminal portion 51 is exposed is a direction parallel to the same plane on which the base plates 50 are provided. The terminal portion 51 extends from the side surface of the mold resin 70. A terminal portion 51*a* of the base plate 50*a* is connected to the battery 9 which is the power supply. A terminal portion 51*e* of the base plate 50*e* is connected to the ground. A terminal portion 51*b* of the base plate 50*b* is connected to U phase of the motor 2 which is a load, and converted power is outputted from the terminal portion 51*b* to U phase of the motor 2. The terminal portions 51*a*, 51*b*, 51*e* are large-current power terminals for which the current amount is large. In FIG. 2, the terminal portion 51*a* and the terminal portion 51*e* are located so as to be arranged on the right side of the semiconductor module 100. In FIG. 2, the terminal portion 51*b* is provided so as to extend in the upward direction of the semiconductor module 100.

A terminal extending to outside from a side surface of the mold resin 70 on the side opposite to a side surface of the mold resin 70 from which the terminal portion 51*b* extends, is a control terminal. The direction in which the control terminal is exposed is a direction parallel to the same plane on which the base plates 50 are provided. The base plate 50*d* and the base plate 50*e* have a terminal portion 51*d* and a terminal portion 51*e*1 for detecting voltage between both ends of the shunt resistor 43. The terminal portion 51*e* and the terminal portion 51*e*1 are at the ground potential. The base plate 50*c* has a terminal portion 51*c* connected to the connection point between the semiconductor switching elements 41, 42, 44. The terminal portion 51*c* is a terminal for monitoring the potential at the connection point between semiconductor switching elements 41, 42, 44.

Each of the terminal members 80 formed in a plate shape has a body portion 82 to which a bonding wire 46 or a bonding wire 47 is connected, and a terminal portion 81 exposed to outside from the side surface of the mold resin 70. The terminal member 80 is a terminal for which the current amount is comparatively small and which is used for control of the semiconductor module 100. In FIG. 2, the terminal members 80 are located so as to be arranged on the lower side of the semiconductor module 100. Terminal members 80*a*, 80*b*, 80*c* are gate-control terminals connected to gate portions of the respective semiconductor switching elements 41, 42, 44. The terminal members 80*a*, 80*b*, 80*c* and the gate portions are connected by bonding wires 46 provided through a wire bonding process.

The wire bonding is performed using the gate portion of each semiconductor switching element 41, 42, 44 as a start point and the terminal member 80 side as a finish point. Therefore, in the wire bonding process, the bonding wire 46 can be cut without damaging each semiconductor switching element 41, 42, 44. A body portion 82*d* of a terminal member 80*d* and a body portion 52*b* of the base plate 50*b* are connected by the bonding wire 47. The terminal member 80*d* is a terminal for monitoring the potential of the terminal portion 51*b* to be outputted to the motor 2.

The mold resin 70 seals the base plates 50, the terminal members 80, the semiconductor switching elements 41, 42, 44 and the shunt resistor 43 which are electronic components, the jumper wires 45, and the bonding wires 46, 47. The outer shape of the mold resin 70 is formed to be a rectangular plate shape having a plate surface parallel to the same plane on which the base plates 50 are provided. The outer shape of the mold resin 70 is not limited to a rectangular plate shape, and for example, may be a shape corresponding to the shape of a part where the semiconductor module 100 is mounted. The other surface of the base plate 50 may be exposed from the mold resin 70 so that the base plate 50 is readily cooled.

Manufacturing of the semiconductor module 100 is performed in a state in which the base plates 50 and the terminal members 80 are connected to the outer frame 90. A manufacturing method for the semiconductor module 100 includes a step of cutting out a plate-shaped conductive member to form a member in which the base plates 50 and the terminal members 80 are connected to the outer frame 90, a step of joining the semiconductor switching elements 41, 42, 44 and the shunt resistor 43 which are electronic components to the base plates 50, a step of connecting the semiconductor switching elements 41, 42, 44 and the base plates 50 by the jumper wires 45, a step of connecting the terminal members 80, and the semiconductor switching elements 41, 42, 44 and the base plate 50*b*, by the bonding wires 46, 47, a step of sealing the base plates 50, the terminal members 80, the semiconductor switching elements 41, 42, 44, the shunt resistor 43, the jumper wires 45, and the bonding wires 46, 47 with the mold resin 70, and a step of separating the outer frame 90 and the terminal portions 51, 81 from each other.

When the outer frame 90 and the terminal portions 51, 81 are separated from each other, the semiconductor module 100 is completed. Since the base plates 50 and the terminal members 80 respectively have the terminal portions 51, 81 exposed to outside from the side surface of the mold resin 70, it is possible to stabilize placement of the base plates 50 and the terminal members 80 in manufacturing of the semiconductor module 100, without using another fixation member such as a jig. Since placement of the base plates 50 and the terminal members 80 is stable, productivity of the semiconductor module 100 can be improved.

<Through Hole 60>

A through hole 60 which is a major part of the present disclosure will be described. The base plate 50*c* has the through hole 60 formed in a rectangular shape, at an extension part 53 which is a part extending toward the terminal portion 51*c* and connected to the terminal portion 51*c*, in the body portion 52*c*. The extension part 53 of the body portion 52*c* of the base plate 50*c* extends in the direction in which the terminal portion 51*c* extends, and is connected to the terminal portion 51*c*.

The reason for providing the through hole 60 will be described. Regarding the terminal portion provided to the semiconductor module, at the time of preheating the tip of the terminal portion in a post-process of mounting the semiconductor module to a device, there is a case where heat is transferred from the terminal portion to the base plate side where the semiconductor switching element is provided, thus deteriorating soldering performance for the terminal portion. Since the current amount in the control terminal is small, the tip part thereof is formed to be thin and also a part of the control terminal led out from the mold resin need not be as thick as the power terminal. Therefore, such a structure that the thinned control terminal extends from the base plate so as to hamper flow of heat can be adopted in terms of the layout of the semiconductor module. However, if the thinned control terminal extends from the base plate, rigidity of the control terminal is reduced. In addition, the thinned control terminal extends from the outer frame to the base plate so as to form a cantilever shape, and thus the control terminal becomes more deflectable.

When the control terminal deflects, a part of the base plate where the control terminal extends is also deformed accordingly. If the base plate is deformed, a level difference arises between the base plate and another base plate provided adjacently. The outer shape of the semiconductor module is deformed due to the level difference, so that the semiconductor module becomes a defective product. Considering this, the control terminal is provided with the extension part 53 extending toward the terminal portion 51*c*, so as to suppress deflection and ensure rigidity of the control terminal. Further, in order to suppress heat conduction from the terminal portion 51*c* to the body portion 52*c* of the base plate 50*c*, the through hole 60 formed in a rectangular shape and for reducing the sectional area of the base plate 50*c* is provided at the extension part 53.

The through hole 60 is formed in an area, inside the mold resin 70, of the extension part 53 of the body portion 52*c* of the base plate 50*c*. Since the through hole 60 is provided inside the mold resin 70, the adhesion area between the base plate 50*c* and the mold resin 70 can be increased. Since the adhesion area between the base plate 50*c* and the mold resin 70 is increased, separation between the base plate 50*c* and the mold resin 70 can be suppressed as compared to a case of not having the through hole 60. In addition, the outer frame 90 to be cut in the post-process can be cut into an area between the tip part of the terminal portion 51*c* and the extension part 53 (area enclosed by a dotted-dashed line in FIG. 2), and thus the terminal portion 51*c* can be thinned without directly extending from the extension part 53, whereby heat conduction can be efficiently hampered.

The long-side lines of the through hole 60 are parallel to the direction in which the terminal portion 51*c* and the extension part 53 of the body portion 52*c* of the base plate 50*c* extend. With this structure, the through hole 60 is formed in a thin elongated shape along the extension part 53, whereby the widths of the through hole 60 and the extension part 53 can be reduced. In addition, since the widths of the through hole 60 and the extension part 53 are reduced, the semiconductor module 100 can be downsized.

The respective widths on both sides of the long-side lines of the through hole 60 in the extension part 53 of the body portion 52*c* of the base plate 50*c* is not less than the width of the tip part of the terminal portion 51*c*. With this structure, since the respective widths of the extension part 53 on both sides of the long-side lines of the through hole 60 are ensured to be not less than the width of the tip part of the terminal portion 51*c*, current flowing to the tip part of the terminal portion 51*c* is not hampered by the extension part 53 on both sides of the long-side lines of the through hole 60.

The respective widths on both sides of the long-side lines of the through hole 60 in the extension part 53 of the body portion 52*c* of the base plate 50*c* are equal to each other. With this structure, heat conduction in the extension part 53 on both sides of the long-side lines of the through hole 60 is uniformed, whereby heat conduction from the terminal portion 51*c* to the body portion 52*c* of the base plate 50*c* can be efficiently suppressed.

In the present embodiment, the through hole 60 formed at the extension part 53 of the base plate 50*c* extends in not only the extension part 53 but also a part where the semiconductor switching element 42 is not joined in the body portion 52*c* of the base plate 50*c*, as shown in FIG. 2. Providing the through hole 60 so as to thus extend can further suppress heat conduction from the terminal portion 51*c* to the body portion 52*c* of the base plate 50*c*. The part where the through hole 60 is provided is not limited thereto, and as shown in FIG. 4, the through hole 60 may be provided only at the extension part 53 of the base plate 50*c*.

In the present embodiment, the extension part 53 of the base plate 50*c* extends in the direction in which the terminal portion 51*c* extends, and is connected to the terminal portion 51*c*, as shown in FIG. 2. However, formation of the extension part 53 is not limited thereto. As shown in FIG. 5, the extension part 53 may extend in a direction (direction of a broken-line arrow shown in FIG. 5) different from the direction in which the terminal portion 51*c* extends, and may be connected to the terminal portion 51*c*. In addition, the shape of the through hole 60 is not limited to a rectangular shape. In such a case where the extension part 53 extends in a direction different from the direction in which the terminal portion 51*c* extends, the shape of the through hole 60 may be a triangular shape as shown in FIG. 5, a trapezoidal shape, or the like. In the present embodiment, the example in which the extension part 53 and the through hole 60 are provided at a part connected to the control terminal in the body portion 52, has been shown. However, without limitation thereto, the extension part 53 and the through hole 60 may be provided at a part connected to the power terminal in the body portion 52.

As described above, in the semiconductor module 100 according to embodiment 1, the base plate 50*c* to which the semiconductor switching element 42 is joined has the body portion 52*c* and the terminal portion 51*c* exposed to outside from the mold resin 70, and the base plate 50*c* has the through hole 60 at the extension part 53 which is a part extending toward the terminal portion 51*c* and connected to the terminal portion 51*c*, in the body portion 52*c*. Thus, the sectional area of the base plate 50*c* is reduced at the extension part 53, whereby heat conduction from the terminal portion 51*c* to the body portion 52*c* of the base plate 50*c* can be suppressed. In the case where the through hole 60 is formed in an area, inside the mold resin 70, of the extension part 53 of the body portion 52*c* of the base plate 50*c*, the adhesion area between the base plate 50*c* and the mold resin 70 can be increased, whereby separation between the base plate 50*c* and the mold resin 70 can be suppressed as compared to a case of not having the through hole 60.

In the case where the extension part 53 of the body portion 52*c* of the base plate 50*c* extends in the direction in which the terminal portion 51*c* extends, and is connected to the terminal portion 51*c*, the width of the extension part 53 can be reduced, whereby the semiconductor module 100 can be downsized. In the case where the long-side lines of the through hole 60 formed in a rectangular shape are parallel to the direction in which the terminal portion 51*c* and the extension part 53 of the base plate 50*c* extend, the through hole 60 is formed in a thin elongated shape along the extension part 53, whereby the widths of the through hole 60 and the extension part 53 can be reduced. In addition, since the widths of the through hole 60 and the extension part 53 are reduced, the semiconductor module 100 can be downsized.

In the case where the respective widths on both sides of the long-side lines of the through hole 60 in the extension part 53 of the base plate 50*c* are not less than the width of the tip part of the terminal portion 51*c*, current flowing to the tip part of the terminal portion 51*c* is not hampered by the extension part 53 on both sides of the long-side lines of the through hole 60, whereby heat generation in the extension part 53 due to the current can be suppressed. In the case where the respective widths on both sides of the long-side lines of the through hole 60 in the extension part 53 of the base plate 50*c* are equal to each other, heat conduction in the extension part 53 on both sides of the long-side lines of the through hole 60 is uniformed, whereby heat conduction from the terminal portion 51c to the body portion 52c of the base plate 50c can be efficiently suppressed.

Embodiment 2

Figure 6:
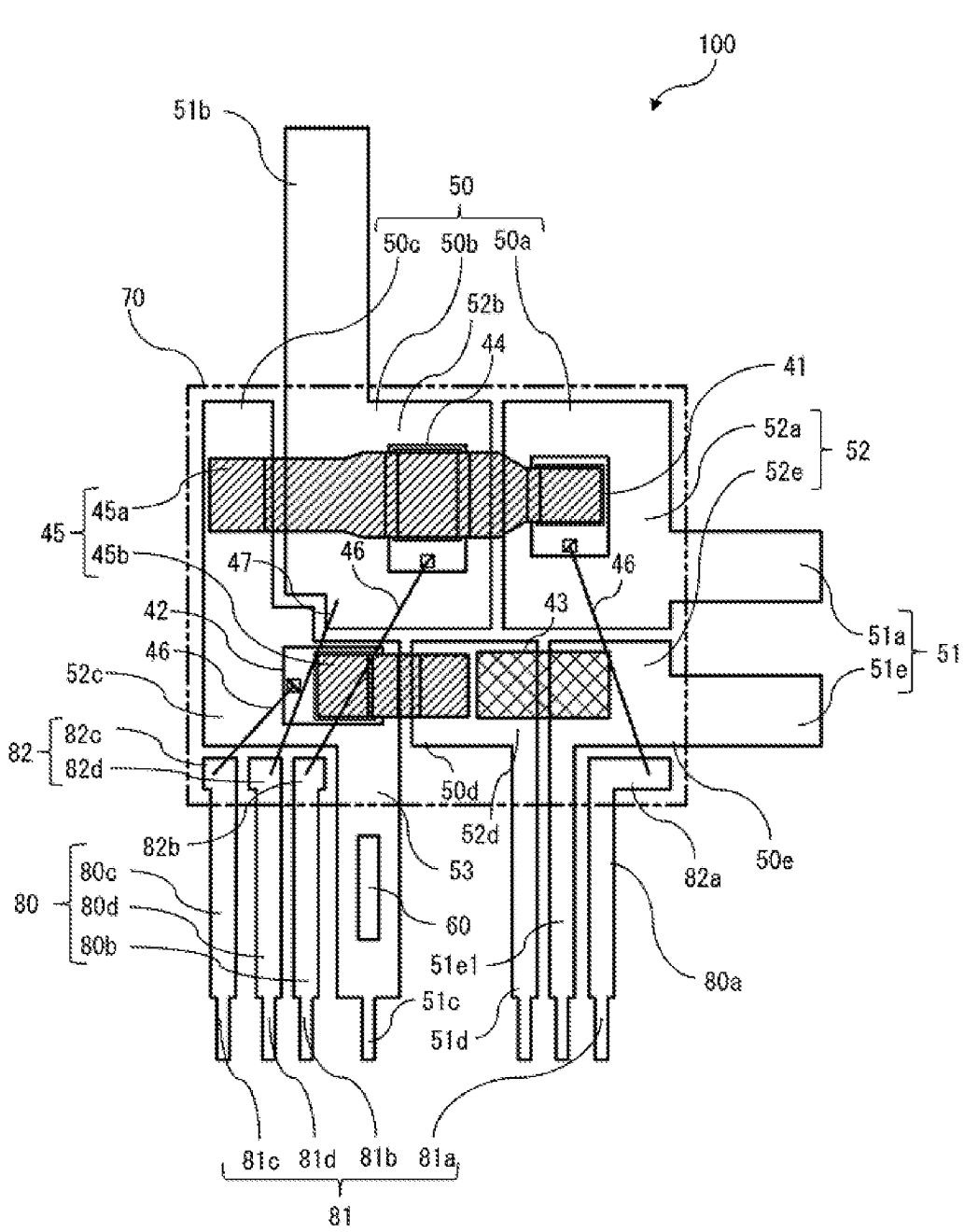
FIG. 6 is a plan view of a semiconductor module according to embodiment 2.
Figure 7:
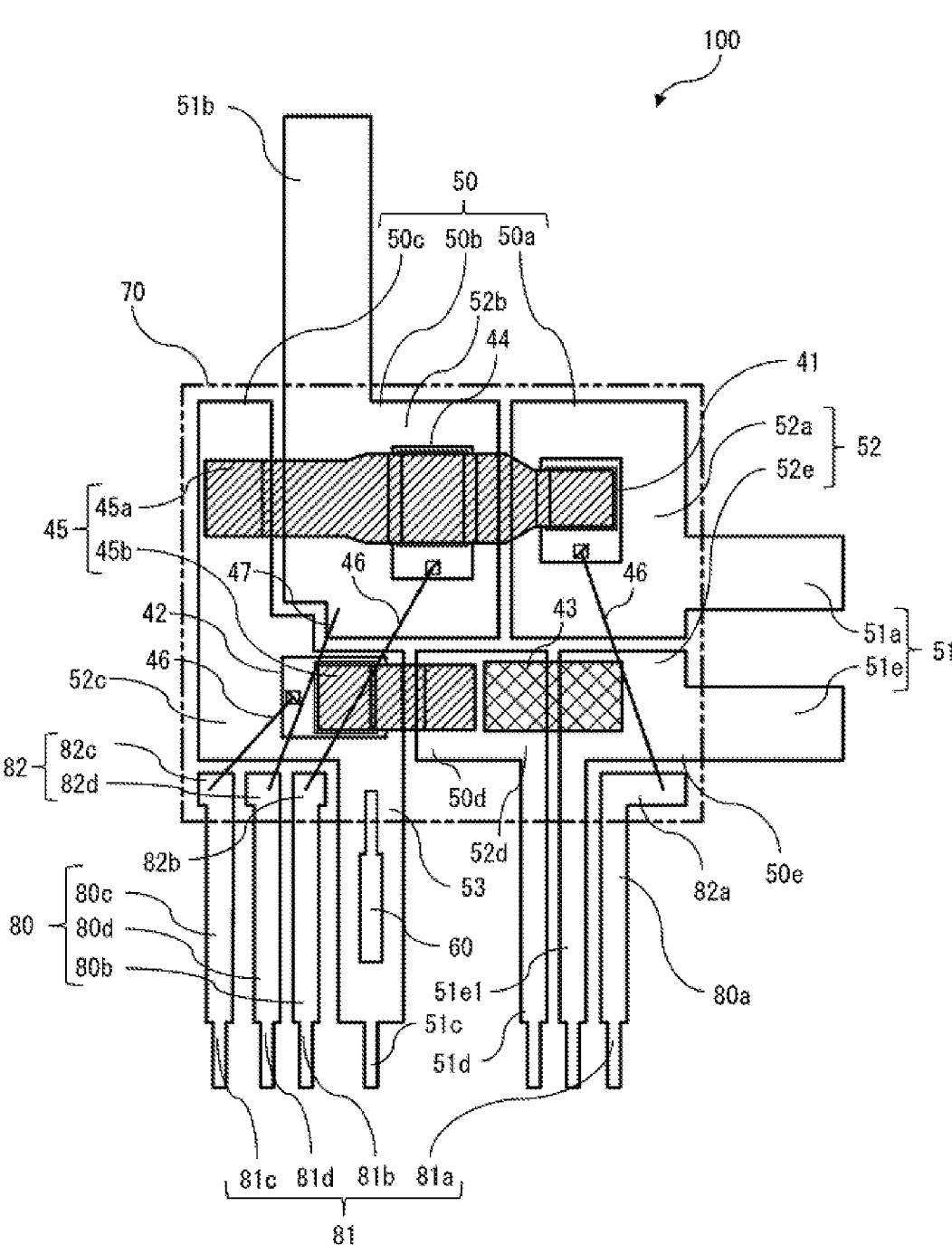
FIG. 7 is a plan view of another semiconductor module according to embodiment 2.

A semiconductor module 100 according to embodiment 2 will be described. FIG. 6 is a plan view of the semiconductor module 100 according to embodiment 2, and FIG. 7 is a plan view of another semiconductor module 100 according to embodiment 2. FIG. 6 shows a state in which the mold resin 70 is removed, and a two-dot dashed line indicates the outer shape of the mold resin 70. In the semiconductor module 100 according to embodiment 2, location of the through hole 60 is different from that in embodiment 1.

The through hole 60 is formed in an area, exposed from the mold resin 70, of the extension part 53 of the body portion 52c of the base plate 50c. The extension part 53 of the body portion 52c of the base plate 50c extends in the direction in which the terminal portion 51c extends, and is connected to the terminal portion 51c. Since the through hole 60 is located so as to be exposed from the mold resin 70, the part where heat conduction from the terminal portion 51c to the body portion 52c of the base plate 50c is suppressed and heat is readily generated can be located away from the semiconductor switching elements 41, 42, 44 and the shunt resistor 43. Since the part where heat is readily generated can be located away from the semiconductor switching elements 41, 42, 44 and the shunt resistor 43, hampering of heat dissipation from the semiconductor switching elements 41, 42, 44 and the shunt resistor 43 which are heat generating bodies can be suppressed.

In the present embodiment, the through hole 60 is located only in an area, exposed from the mold resin 70, of the extension part 53 of the base plate 50c. Therefore, the semiconductor switching element 42 joined to the base plate 50c can be located on the center side of the semiconductor module 100. Since the semiconductor switching element 42 is located on the center side of the semiconductor module 100, heat dissipation from the semiconductor switching element 42 is improved. In addition, ease of layout of the electronic components on the semiconductor module 100 can be improved. In addition, the semiconductor module 100 can be downsized.

In the present embodiment, the through hole 60 is located only in an area, exposed from the mold resin 70, of the extension part 53 of the base plate 50c. However, location of the through hole 60 is not limited thereto. A part of the through hole 60 may be additionally provided also inside the mold resin 70, as shown in FIG. 7. Providing the through hole 60 inside the mold resin 70 can suppress separation between the base plate 50c and the mold resin 70. Here, for suppressing heat generation of the extension part 53 on both sides of the through hole 60, the width of the through hole 60 provided inside the mold resin 70 is reduced. In FIG. 7, parts of the through hole 60 provided both inside and outside the mold resin 70 are integrated as one through hole 60. However, the through holes 60 may be provided separately both inside and outside the mold resin 70.

As described above, in the semiconductor module 100 according to embodiment 2, the through hole 60 is formed in an area, exposed from the mold resin 70, of the extension part 53 of the body portion 52c of the base plate 50c. Thus, the part where heat conduction from the terminal portion 51c to the body portion 52c of the base plate 50c is suppressed and heat is readily generated can be located away from the semiconductor switching elements 41, 42, 44 and the shunt resistor 43, whereby hampering of heat dissipation from the semiconductor switching elements 41, 42, 44 and the shunt resistor 43 which are heat generating bodies can be suppressed.

Embodiment 3

Figure 8:
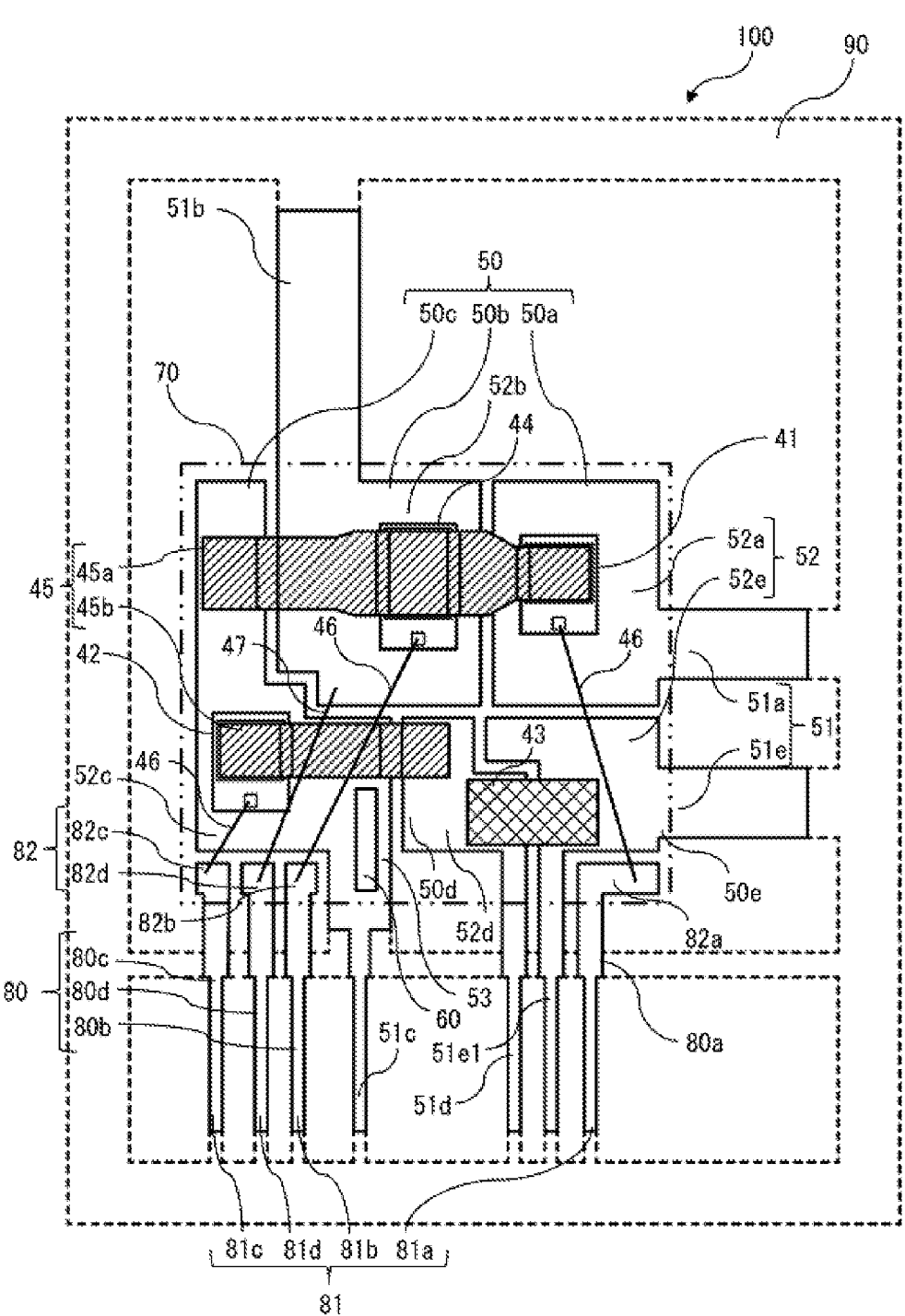
FIG. 8 is a plan view of a semiconductor module according to embodiment 3.
Figure 9:
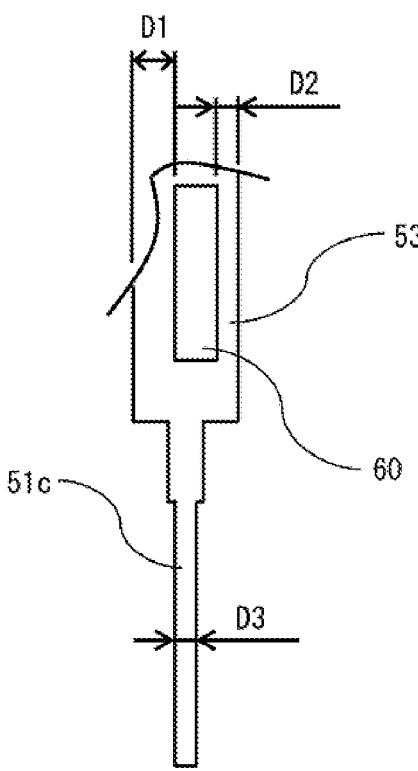
FIG. 9 is a major part plan view of the semiconductor module according to embodiment 3.

A semiconductor module 100 according to embodiment 3 will be described. FIG. 8 is a plan view of the semiconductor module 100 according to embodiment 3, and FIG. 9 is a major part plan view of the semiconductor module 100. FIG. 8 shows a state in which the mold resin 70 is removed, and a two-dot dashed line indicates the outer shape of the mold resin 70. In the semiconductor module 100 according to embodiment 3, location of the through hole 60 is different from that in embodiment 1.

The extension part 53 of the body portion 52c of the base plate 50c extends in the direction in which the terminal portion 51c extends, and is connected to the terminal portion 51c. The long-side lines of the through hole 60 formed in a rectangular shape are parallel to the direction in which the terminal portion 51c and the extension part 53 of the body portion 52c of the base plate 50c extend. The respective widths on both sides of the long-side lines of the through hole 60 in the extension part 53 of the body portion 52c of the base plate 50c are different from each other, and the sum of the respective widths on both sides of the long-side lines of the through hole 60 is not less than the width of the tip part of the terminal portion 51c. FIG. 9 is an enlarged view of the extension part 53 and the terminal portion 51c. In FIG. 9, the respective widths on both sides of the long-side lines of the through hole 60 are defined as D1 and D2. The width of the tip part of the terminal portion 51c is defined as D3. The through hole 60 is located at the extension part 53 such that the relationship of these widths satisfies (D1+D2) D3. With this structure, since the sum of the respective widths of the extension part 53 on both sides of the long-side lines of the through hole 60 is ensured to be not less than the width of the tip part of the terminal portion 51c, current flowing to the tip part of the terminal portion 51c is not hampered by the extension part 53 on both sides of the long-side lines of the through hole 60.

Since the respective widths of the extension part 53 on both sides of the long-side lines of the through hole 60 are different from each other, the extension part 53 whose width is locally narrowed can be provided, whereby it is possible to provide a part where heat conduction from the terminal portion 51c to the body portion 52c of the base plate 50c is locally suppressed. In addition, the width D1 of the extension part 53 at a position near the semiconductor switching element 42 is greater than the width D2 of the extension part 53 at a position away from the semiconductor switching element 42. Thus, the part where heat conduction from the terminal portion 51c to the body portion 52c of the base plate 50c is suppressed and heat is readily generated can be located away from the semiconductor switching element 42, whereby hampering of heat dissipation from the semiconductor switching element 42 which is a heat generating body can be suppressed.

As described above, in the semiconductor module 100 according to embodiment 3, the respective widths on both sides of the long-side lines of the through hole 60 in the extension part 53 of the base plate 50c are different from each other, and the sum of the respective widths on both sides of the long-side lines of the through hole 60 is not less than the width of the tip part of the terminal portion 51c. Thus, current flowing to the tip part of the terminal portion 51c is not hampered by the extension part 53 on both sides of the long-side lines of the through hole 60, whereby heat generation in the extension part 53 due to the current can be suppressed.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure. It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE
CHARACTERS

1 control unit
2 motor
3 control circuit
4 inverter circuit
4a bridge circuit
5 power supply relay
5a semiconductor switching element
5b semiconductor switching element
6 rotation sensor
7 capacitor
8 sensor
9 battery
10 ignition switch
30 CPU
31 driving circuit
32 input circuit
33 power supply circuit
41 semiconductor switching element
42 semiconductor switching element
43 shunt resistor
44 semiconductor switching element
45 jumper wire
46 bonding wire
47 bonding wire
48 terminal
50 base plate
51 terminal portion
52 body portion
53 extension part
60 through hole
70 mold resin
80 terminal member
81 terminal portion
82 body portion
90 outer frame
100 semiconductor module
200 electric power steering device

The invention claimed is:
1. A semiconductor module comprising:
a base plate formed in a plate shape;
a terminal member;

12 an electronic component joined to one surface of the base plate; and
mold resin sealing the base plate, the terminal member, and the electronic component, wherein
the base plate and the terminal member are conductive members and are arranged with an interval therebetween on the same plane,
each of the base plate and the terminal member has a body portion and a terminal portion exposed to outside from the mold resin, and
the base plate has a through hole at an extension part which is a part extending toward the terminal portion and connected to the terminal portion, in the body portion,
wherein the body portion has a width larger than the terminal portion in a direction perpendicular to a direction in which the terminal portion extends from the body portion.

2. The semiconductor module according to claim 1, wherein
the through hole is formed in an area, inside the mold resin, of the extension part of the body portion of the base plate and the mold resin completely fills in the through hole.

3. The semiconductor module according to claim 1, wherein
the through hole is completely formed in an area outside of the mold resin, of the extension part of the body portion of the base plate.

4. The semiconductor module according to claim 1, wherein
the extension part of the body portion of the base plate extends in a direction in which the terminal portion extends, and is connected to the terminal portion.

5. The semiconductor module according to claim 2, wherein
the extension part of the body portion of the base plate extends in a direction in which the terminal portion extends, and is connected to the terminal portion.

6. The semiconductor module according to claim 3, wherein
the extension part of the body portion of the base plate extends in a direction in which the terminal portion extends, and is connected to the terminal portion.

7. The semiconductor module according to claim 4, wherein
long-side lines of the through hole formed in a rectangular shape are parallel to a direction in which the terminal portion and the extension part of the body portion of the base plate extend.

8. The semiconductor module according to claim 5, wherein
long-side lines of the through hole formed in a rectangular shape are parallel to a direction in which the terminal portion and the extension part of the body portion of the base plate extend.

9. The semiconductor module according to claim 6, wherein
long-side lines of the through hole formed in a rectangular shape are parallel to a direction in which the terminal portion and the extension part of the body portion of the base plate extend.

10. The semiconductor module according to claim 7, wherein
respective widths on both sides of the long-side lines of the through hole in the extension part of the body portion of the base plate are not less than a width of a tip part of the terminal portion.

11. The semiconductor module according to claim 8, wherein respective widths on both sides of the long-side lines of the through hole in the extension part of the body portion of the base plate are not less than a width of a tip part of the terminal portion.

12. The semiconductor module according to claim 9, wherein respective widths on both sides of the long-side lines of the through hole in the extension part of the body portion of the base plate are not less than a width of a tip part of the terminal portion.

13. The semiconductor module according to claim 10, wherein the respective widths on both sides of the long-side lines of the through hole in the extension part of the body portion of the base plate are equal to each other.

14. The semiconductor module according to claim 11, wherein the respective widths on both sides of the long-side lines of the through hole in the extension part of the body portion of the base plate are equal to each other.

15. The semiconductor module according to claim 12, wherein the respective widths on both sides of the long-side lines of the through hole in the extension part of the body portion of the base plate are equal to each other.

16. The semiconductor module according to claim 7, wherein respective widths on both sides of the long-side lines of the through hole in the extension part of the body portion of the base plate are different from each other, and a sum of the respective widths on both sides of the long-side lines of the through hole is not less than the width of a tip part of the terminal portion.

17. The semiconductor module according to claim 8, wherein respective widths on both sides of the long-side lines of the through hole in the extension part of the body portion of the base plate are different from each other, and a sum of the respective widths on both sides of the long-side lines of the through hole is not less than the width of a tip part of the terminal portion.

18. The semiconductor module according to claim 9, wherein respective widths on both sides of the long-side lines of the through hole in the extension part of the body portion of the base plate are different from each other, and a sum of the respective widths on both sides of the long-side lines of the through hole is not less than the width of a tip part of the terminal portion.

* * * * *